(12) United States Patent  
Hoffmann (10) Patent No.: US 7,453,758 B2  
(45) Date of Patent: Nov. 18, 2008

(54) CONTROL SYSTEM FOR A DYNAMIC RANDOM ACCESS MEMORY AND METHOD OF OPERATION THEREOF

(75) Inventor: Jochen Hoffmann, Colchester, VT (US)

(73) Assignee: Infineon Technologies AG, Munich (DE)

( * ) Notice: Subject to any disclaimer, the term of this patent is extended or adjusted under 35 U.S.C. 154(b) by 254 days.

(21) Appl. No.: 11/358,821

(22) Filed: Feb. 21, 2006

(65) Prior Publication Data

US 2007/0195631 A1    Aug. 23, 2007

(51) Int. Cl.  
*G11C 8/00* (2006.01)

(52) U.S. Cl. ............................ 365/230.04; 365/189.16

(58) Field of Classification Search ............ 365/230.04, 365/189.16  
See application file for complete search history.

(56) References Cited

U.S. PATENT DOCUMENTS

| | | | |
|---|---|---|---|
| 5,661,678 A | 8/1997 | Yoshida et al. | |
| 6,449,204 B1 | 9/2002 | Arimoto et al. | |
| 6,452,855 B1 | 9/2002 | Hsu et al. | |
| 6,549,483 B2 | 4/2003 | Kurjanowicz et al. | |
| 6,594,195 B2 | 7/2003 | Chen | |
| 6,850,449 B2 | 2/2005 | Takahashi | |
| 6,859,384 B2 | 2/2005 | Tomishima | |
| 6,879,537 B2 | 4/2005 | Takahashi et al. | |
| 6,925,021 B2 | 8/2005 | Cowles et al. | |
| 7,154,799 B2 * | 12/2006 | Matsuzaki | 365/222 |
| 7,177,183 B2 * | 2/2007 | Scheuerlein et al. | 365/185.02 |
| 7,349,278 B2 * | 3/2008 | Min et al. | 365/222 |
| 2003/0214832 A1 * | 11/2003 | Okamoto et al. | 365/149 |
| 2007/0014175 A1 * | 1/2007 | Min et al. | 365/222 |

* cited by examiner

*Primary Examiner*—Tuan T. Nguyen  
(74) *Attorney, Agent, or Firm*—Slater & Matsil, L.L.P.

(57) ABSTRACT

A dynamic random access memory device includes an array of dynamic random access memory cells subdivided into a group of blocks. Each of the blocks of memory cells can be independently operated in either a single cell mode or a twin cell mode.

15 Claims, 6 Drawing Sheets

Registers used to control sub-array modes

| Segment | 0 | 1 | 2 | 3 | 4 | 5 | 6 | 7 |
|---|---|---|---|---|---|---|---|---|
| Fast-Ref | 1 | 0 | 0 | 0 | 0 | 0 | 0 | 0 |
| Twin-Cell | 0 | 1 | 1 | 1 | 1 | 1 | 1 | 1 |
| SngToTwin | 0 | 0 | 0 | 0 | 0 | 0 | 0 | 0 |

FIGURE 5A

| Counter-Value | Fast-Ref | Refresh | Segment-Address |
|---|---|---|---|
| 0 | 1 | yes | 0 |
| 1 | 0 | yes | 1 |
| 2 | 0 | yes | 2 |
| 3 | 0 | yes | 3 |
| 4 | 0 | yes | 4 |
| 5 | 0 | yes | 5 |
| 6 | 0 | yes | 6 |
| 7 | 0 | yes | 7 |
| 8 | 1 | yes | 8 |
| 9 | 0 | no | 9 |
| 10 | 0 | no | 10 |
| 11 | 0 | no | 11 |
| 12 | 0 | no | 12 |
| 13 | 0 | no | 13 |
| 14 | 0 | no | 14 |
| 15 | 0 | no | 15 |
| 16 | 1 | yes | 0 |
| 17 | 0 | no | 1 |
| 18 | 0 | no | 2 |
| 19 | 0 | no | 3 |
| 20 | 0 | no | 4 |
| 21 | 0 | no | 5 |
| 22 | 0 | no | 6 |
| 23 | 0 | no | 7 |
| 24 | 1 | yes | 8 |
| 25 | 0 | no | 9 |
| 26 | 0 | no | 10 |
| 27 | 0 | no | 11 |
| 28 | 0 | no | 12 |
| 29 | 0 | no | 13 |
| 30 | 0 | no | 14 |
| 31 | 0 | no | 15 |

CONTROL SYSTEM FOR A DYNAMIC RANDOM ACCESS MEMORY AND METHOD OF OPERATION THEREOF

TECHNICAL FIELD

The present invention is directed, in general, to memory devices and, in a particular embodiment, to a control system and method for a dynamic random access memory.

BACKGROUND

Many electronic products such as a personal computer, digital camera and cellular telephone employ a fair amount of memory to store significant amounts of information. Different storage media in conjunction with varying storage techniques are employed to manage the information associated with a particular application. Several examples of memory devices include a hard drive, compact disc, flash memory, static random access memory (SRAM) and dynamic random access memory (also referred to as a DRAM).

Each memory device has a unique set of advantages and disadvantages that form a basis to employ the device in a particular application. For instance, some memory devices such as a hard drive and flash memory store information without a need for an uninterruptible power supply. Some other memory devices such as a compact disc allow for a swapping of a data carrier thereby providing an environment for mass storage. Some other memory devices such as a SRAM allow for very fast access to random data thereby providing a solution for an application wherein latency is a concern.

An advantage associated with a DRAM is that the memory device is significantly less expensive than other memory devices such as a flash memory or SRAM. The DRAM, however, suffers from a number of drawbacks. For instance, the DRAM calls for a continuous power source to operate, and the DRAM is slower than some memory devices such as the SRAM. The DRAM also performs internal refresh cycles to maintain the information stored in the memory cells thereof. A refresh current associated with the internal refresh cycles contributes to a standby current of the DRAM. Consequently, a value of the standby current for the DRAM is typically much larger in comparison to other memory devices. Also, the internal refresh cycles block the DRAM from being accessed, making it more difficult to attain a certain data throughput and providing a lower system latency. Finally, additional logic is often employed in a DRAM control system to manage the internal refresh cycles.

Although the aforementioned restrictions are prevalent, the DRAM technology has not only survived, but it has been developed into specialized categories aimed at populating areas of the memory market that were previously occupied by other memory devices such as the flash memory or SRAM. As an example, while a reduced latency DRAM employs a larger surface area, the memory device was developed to compete with the SRAM for applications demanding faster access times such as network routers. Also, low power DRAMs were developed for hand held applications such as a cellular telephone wherein an extended battery life is a major advantage.

New applications for handheld devices such as a cellular telephone is causing the memory demands associated therewith to increase significantly. At the same time, there is a fierce battle to control product costs to access a broader customer base. The DRAMs could be a viable contender to fill this void if the standby current is reduced.

Regarding the architecture, the DRAMs store information on capacitors (i.e., the memory cells) that are connected to sense amplifiers using an access transistor. A two dimensional array structure is used for the memory cells and their corresponding transistors. A row of transistors is selected by a common word-line connected to the gates of the transistors. While the source of the transistor is connected to the memory cell, the drain is connected to a bit-line which is connected to the sense amplifier. While a plurality of transistors is connected to each bit-line, typically a single transistor is active at a time (i.e., typically only one word-line is active). This configuration allows one row of the memory array to be read out, be amplified and then be written back into the corresponding memory cells at a time.

Since a capacitance of a memory cell is typically less than a capacitance of the bit-line (e.g., around 5 times), the sense amplifier should be able to sense small differences in the bit-line voltage. A technique that is commonly used precharges the bit-line to an intermediate voltage level that is between an upper and lower level stored in the memory cells. The negative plate of the capacitor is connected to the intermediate voltage (or an equal voltage on a separate net) as well.

The sense amplifier is typically a differential amplifier that is connected to two independent bit-lines. When a row is activated, one of the bit-lines is connected to an actual memory cell. As a result, the bit-line that is connected to a memory cell exhibits either a slight increase in voltage level (when a high voltage level is stored in the memory cell) or a slight decrease in voltage level (when a low voltage level is stored in the memory cell), while the other bit-line remains at the intermediate voltage level. The difference between the voltage levels of the bit-lines is then detected by the sense amplifier.

Since DRAM memory cells are capacitors, the memory cells lose the information stored therein over time. The memory cells, therefore, are refreshed (read out and rewritten) during a defined period of time. The period of time is typically designated in a product specification as refresh or retention time and is often in the range of 64 to 256 milliseconds (ms). The period of time that a memory cell can maintain its data depends on a wide range of design and technology parameters.

Figure 1:
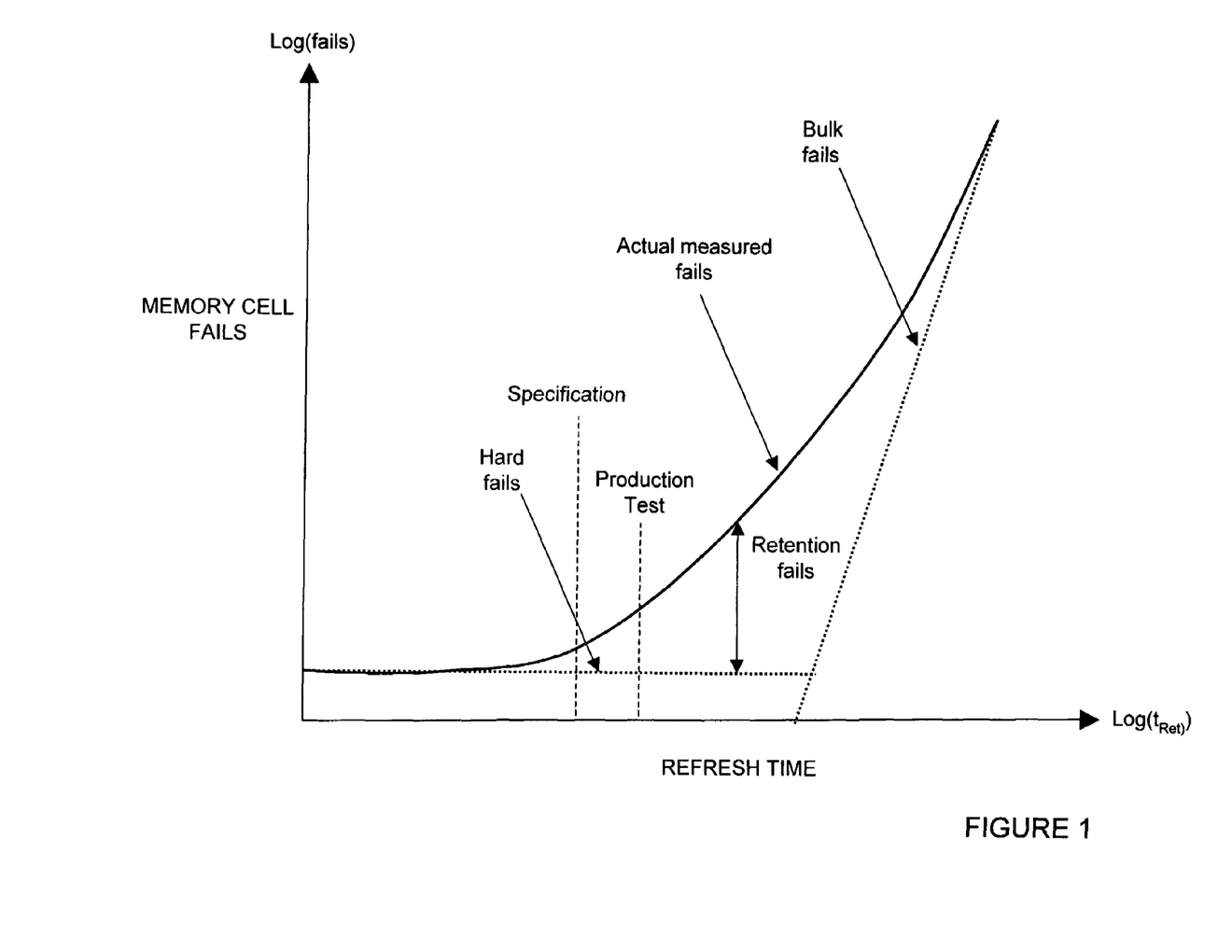
FIG. 1 illustrates an x-y diagram demonstrating a relationship between memory cell fails versus refresh time for a DRAM.

Regarding memory fails, apart from shorts resulting from process inaccuracies (e.g., foreign materials, mask errors) that cause hard fails, other types of fails such as retention fails and bulk fails may be distinguished. The retention fails are defined as fails resulting from weak memory cells or memory cells that exhibit some type of marginality. The retention fails may be reproduced and often repaired. Bulk fails occur due to a normal statistical discharge of memory cells and are random in nature. FIG. 1 demonstrates a typical relationship of memory cell fails versus the time between refreshes or a refresh time of a DRAM.

During a production test, the DRAMs are tested for fails and are subsequently repaired using redundant array elements that are available on an integrated circuit employing the DRAMs. The tests are normally performed with a retention time that is several times larger than a retention time of the DRAM under test (e.g., 256 ms test for a 64 ms component). Inasmuch as the retention fails are predictable, theoretically it is possible to repair the DRAMs at a refresh time close to the border when the bulk fails start to appear. In reality, however, this is not plausible because the number of retention fails at the point of the bulk fails is too large to be completely repaired by redundancy. Therefore, the production tests are usually performed employing a retention time that is several times smaller than the time when a first bulk fail appears. Nevertheless, the number of retention fails is relatively small in comparison to the total number of memory cells that form the DRAMs of the integrated circuit.

The refresh time is inversely proportional to a standby current of the memory device. Even when inactive, the DRAM executes refresh cycles internally so as to avoid a loss of information. The longer a period between refreshes, the lower the standby current. For DRAMs employable in mobile applications (e.g., cellular telephone), the standby current can have a significant impact on a battery life thereof.

Accordingly, what is needed in the art is system and method for use with a DRAM that reduces the effects of the refresh cycles on the standby current of the DRAM without substantially hindering an operation thereof in view of the escalating memory demands of an electronic device employing the DRAM to advantage.

SUMMARY OF THE INVENTION

These and other problems are generally solved or circumvented, and technical advantages are generally achieved, by advantageous embodiments of the present invention which includes a memory device with an array of dynamic random access memory cells subdivided into a group of blocks. Each of the blocks of memory cells can be independently operated in either a single cell mode or a twin cell mode.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a control system for a DRAM, a method of operating a DRAM, and a DRAM employing the system and method. The principles of the present invention, however, may also be applied to other memory devices exhibiting analogous characteristics to a DRAM. The advantages associated with the control system and resulting memory device further exploit the benefits associated with the application of DRAMs in electronic devices.

Figure 2:
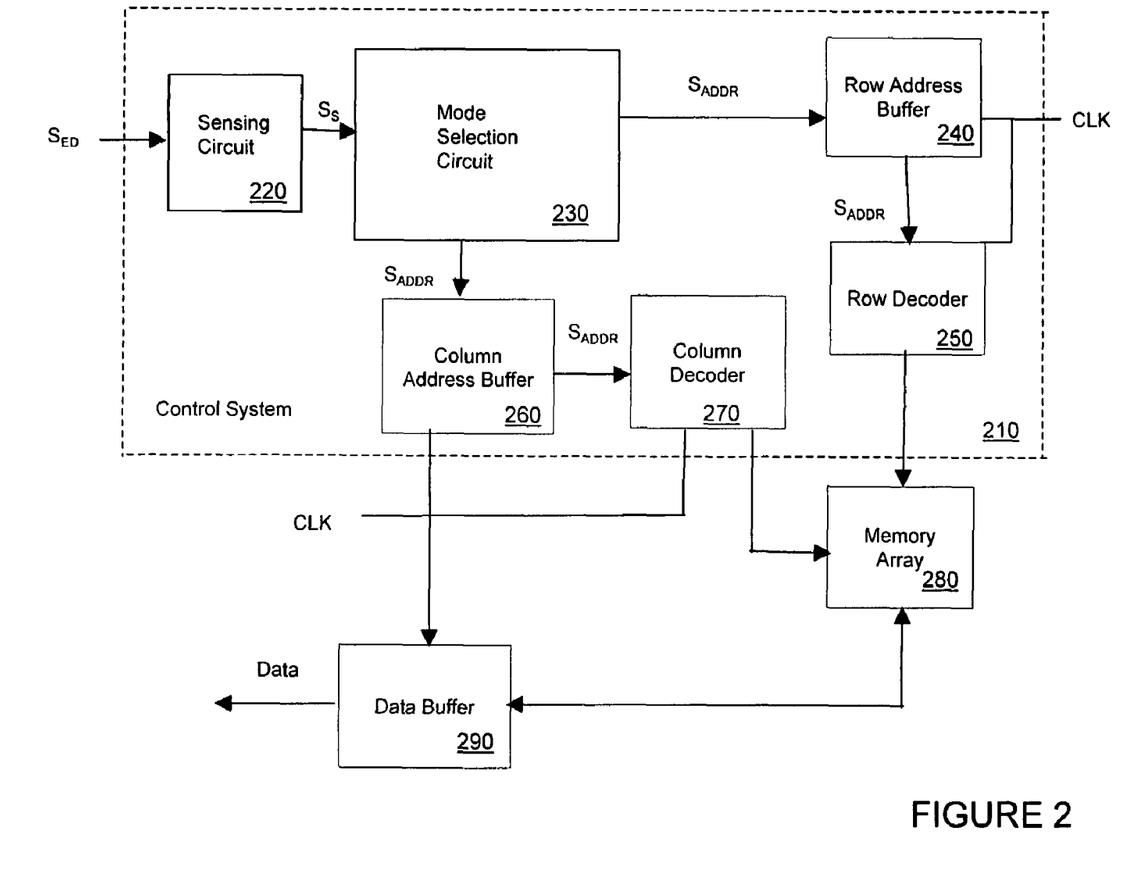
FIG. 2 illustrates a block diagram of an embodiment of a DRAM constructed according to the principles of the present invention.

Referring to FIG. 2, a block diagram of an embodiment of a DRAM constructed according to principles of the present invention is illustrated. The DRAM includes access or control circuitry 210, a memory array 280, and a data buffer 290. The control system includes a row address buffer 240, row decoder 250, column address buffer 260 and column decoder 270. To access a particular memory cell in the memory array 280, an address selection signal SADDR is transmitted to the row address buffer 240 and column address buffer 260. The column address and row address of the DRAM typically share external pins so that the row address is received prior to the column address.

The row and column address buffers 240, 260 are adapted to buffer the address selection signal SADDR provided via the control system 210. The outputs of the row and column address buffers 240, 260 are coupled to the row and column decoders 250, 270, respectively. The row and column decoders 250, 270 are adapted to decode the address selection signal SADDR from the row and column address buffers 240, 260, respectively, to provide signals to the memory array 280 such that particular rows and columns can be selected. While the row and column decoders 250, 270 are each illustrated as a single functional unit, it should be understood that the row and column decoders 250, 270 are often embodied in multiple levels of pre-decoding and decoding subsystems, some or none of which are synchronously clocked.

Data located in the memory array 280 is written thereto or read therefrom via the data buffer 290. The data buffer 290 and accompanying paths are provided to represent the read and write paths, which may include a larger number of systems and paths (e.g., sense amplifiers and/or buffers). Clock signals CLK are provided to the many subsystems of the DRAM to illustrate that the DRAM should be synchronous. It should be understood that while the clock signal CLK could be provided to various elements in the memory array 280, a number of clocking signals, which may operate continuously or only when needed, may be derived from a clock.

A sensing circuit 220 of the control system 210 detects an operational status of an electronic device employing the DRAM. The operational status of the electronic device may be provided, via an electronic device signal SED, by another controller in the electronic device or from a source external of the DRAM device. The sensing circuit 220 provides a status signal Ss to a mode selection circuit 230 of the control system 210. The mode selection circuit 230 selects one of a normal mode and a low power mode as a function of the status signal Ss.

Thus, in accordance with principles of the present invention, the DRAM incorporates two modes of operation, e.g., a normal mode that embodies a mode typically defined in a DRAM specification (see exemplary specification provided below) and a low power mode that embodies a mode wherein, for instance, only about half of an address space of the memory array 280 is available. As a result, however, a refresh current of the DRAM is significantly reduced when employing the low power mode. Toggling between the two modes of operation may be done without losing information stored in the portion of the memory array 280 that is accessible in both the normal and low power modes of operation.

Inasmuch as switching between the two modes of operation consumes power, the mode selection circuit 230 (in accordance with the status signal Ss) should be configured to limit a transition to the low power mode when, for instance, the low power mode extends for a period of time equaling about two-and-a-half times a refresh time of the DRAM. Also, since the memory array 280 of the DRAM should be refreshed prior to the transition between the normal and low power modes of operation, short delays (e.g., in a range of milliseconds) may occur in the availability of the DRAM for the electronic device. While access to the memory array 280 may be possible during the low power mode and related transitions between the modes of operation, providing access during those periods of time consumes additional power thereby detracting from the gains demonstrated by the control system 210 herein. Thus, the low power mode should be limited to extended periods of time wherein little or very limited DRAM activity can be anticipated.

In one embodiment, the memory can be divided into n sub-arrays, where each sub-array can individually be operated in either twin- or single-cell mode. A series of latches can be used to store the mode of each sub-array and whether it is in transition from one mode to the other. A control register allows the user to program these latches and force either twin-, single- or mixed-mode. The control register can also allow the enabling of an adaptive mode in which the memory will select an optimum mode of operation on its own based on the address-location of accesses that are requested.

A refresh-pulse generating circuit (oscillator, counter and decoder) can be included to decode the fuse-latches and, depending on their states, apply refreshes in distinct time-intervals to each sub-array depending on whether this sub-array is currently configured to work in single-, twin-cell mode or is in transition. An address-scrambler can address the array in a fashion that allows the transition between the two operating-modes to be executed concurrently with user-requested accesses when in adaptive mode (thus eliminating the need for a distinct transitioning-phase during which the access to the device is prohibited).

Memories as described herein can be used in a number of applications. In but one example, a DRAM constructed according to the principles of the present invention is well suited for electronic devices performing multimedia applications such as a cellular telephone with a built in digital camera (hereinafter referred to as a camera) recording motion picture experts group (MPEG) movies. A user might record a short film, then dial a number and transmit the movie to a friend. Internally, the camera transfers data from a charge-coupled device to the DRAM in an uncompressed fashion. Once the movie has been recorded, a processor converts the data into an MPEG format and writes the MPEG formatted data back into the DRAM wherein the data remains for subsequent transmission. The memory of the present invention works well in other applications as well.

Two phases of DRAM activity can be distinguished during the aforementioned example. Prior to focusing on a subject, the camera is typically in a sleep phase and very little DRAM activity is necessary. As soon as the user selects a focus button, the camera activates an active phase and a delay in the range of milliseconds will be transparent to the user as the camera focuses on the subject. Typically, the camera remains in the active phase and the DRAM activity increases until the filming and subsequent compression of the media is complete. Thereafter, when the camera returns to the sleep phase, the DRAM activity decreases and an availability of about half of the memory array 280 is acceptable during this period of time. Moreover, the period of time between filming or filming and transmitting the media is significantly greater than 500 ms. Thus, entering a sleep phase during these periods of low activity from a current consumption point of view is satisfactory.

The active phase and sleep phase embody two exemplary operational status of an electronic device in accordance with the principles of the present invention. Also, while this is only an example, most applications employ significantly more of the memory array 280 of the DRAM while in the active phase as compared to sleep phase. A limitation, therefore, that only about half of the memory array 280 is available in sleep phase is acceptable for a range of applications.

Figure 3:
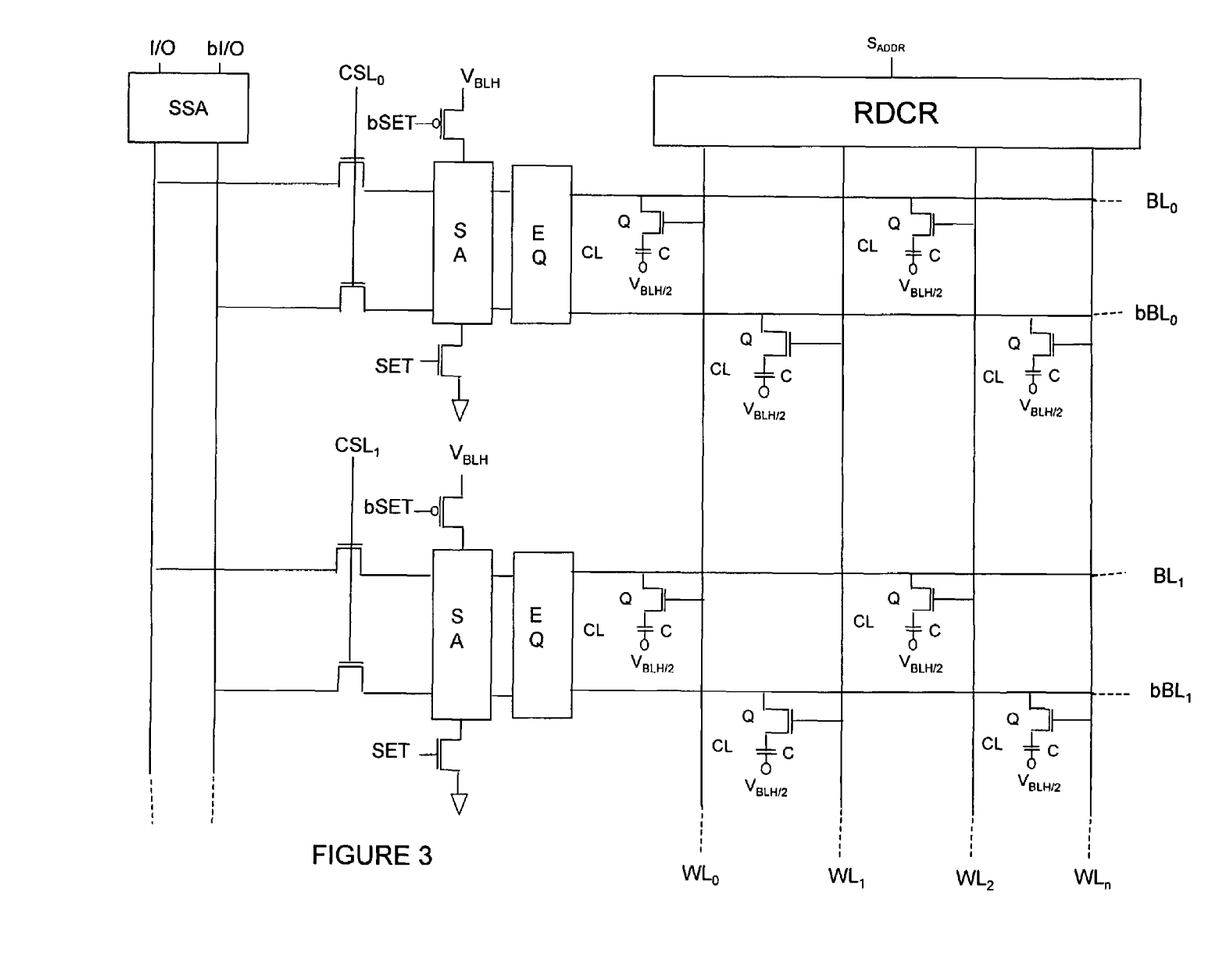
FIG. 3 illustrates a schematic diagram of an embodiment of a memory array of a DRAM constructed according to the principles of the present invention

Turning now to FIG. 3, a schematic diagram illustrates an embodiment of a memory array of a DRAM constructed according to the principles of the present invention. The memory array includes a plurality of memory cells (generally designated CL) arranged in a matrix-type architecture. Each memory cell CL includes an access transistor (generally designated Q), typically an n-channel metal oxide semiconductor field effect transistor, coupled in series with a capacitor (generally designated C). The gate of each transistor Q is coupled to a word-line (generally designated WL), of which first, second, third and "n" word-lines WL0, WL1, WL2, WLn, respectively, are illustrated in the memory array. One source/drain region of the transistor Q of each memory cell CL is coupled to a bit-line (generally designated BL) such as the first and second bit-lines BL0, BL1, respectively, illustrated in the memory array. A second source/drain region of the transistor Q of each memory cell CL is coupled to a first plate of a capacitor C. A second plate of the capacitor C is coupled to a reference voltage (e.g., one half of a bit-line high voltage VBLH/2).

The bit-lines BL are organized as bit-line pairs, namely, a first bit-line and first bit-line bar BL0, bBL0, respectively, and a second bit-line and second bit-line bar BL1, bBL1, respectively. Each bit-line pair is coupled to a sense amplifier SA, which is configured to amplify a voltage difference between a bit-line BL and a bit-line bar bBL. A traditional mid-level sensing is accomplished using latch-type sense amplifiers SA with a high voltage level of about 1.5 volts for the bit-lines BL. Equalization and pre-charge circuitry (also referred to as equalization circuitry and generally designated EQ) is also coupled between each bit-line pair to provide proper initial voltages thereon.

In an exemplary embodiment, the memory array may include four 128 megabit (Mb) memory quadrants, each of which corresponds to an individual logical bank. Each 128 Mb memory quadrant may be separated into a number of blocks such as 16 blocks, each with 8 Mb in a folded bit-line configuration. There may be 512 bits for each bit-line BL and a bit-line-to-bit-line noise can be reduced by twisting the bit-lines BL. A block may include 1024 local word-lines WL. The blocks may be separated by sense amplifiers (e.g., 4 k sense amplifiers) SA on opposite sides, which are shared by neighboring blocks. Each block may then be divided into 16 sections by row-gaps with each section containing 512 kilobits (kb). A local data line may span two sections so that, in a column direction, the sections are paired, forming eight column segments.

In operation, the bit-lines BL are pre-charged to an initial value wherein a bit-line high voltage VBLH may equal about 1.5 volts. Preferably, the bit-line high voltage VBLH is locally generated. The equalization circuitry EQ is enabled via an equalization signal and is provided to ensure that each bit-line BL is pre-charged to about the same value (e.g., one half of the bit-line high voltage VBLH/2 or about 0.75 volts). To read a data bit from the memory array, a high voltage derivable, for instance, from an external supply voltage is placed on a selected one of the word-lines WL. The selected one of the word-lines WL is selected by a row decoder RDCR analogous to the row decoder as illustrated and described with respect to FIG. 2.

The high voltage on the word-line WL will cause the transistor Q of each memory cell CL coupled to the respective word-line WL to be conductive. Accordingly, a charge will travel either to the bit-line BL from the memory cell CL (in the case of a logical one, e.g., a high bit-line voltage VBHL) or from the bit-line BL to the memory cell CL (in the case of a logical zero, e.g., zero volts). The sense amplifier SA, when activated by a signal SET, will sense the logical one or zero and generate a differential voltage that corresponds with the signal read from the memory cell CL.

A pair of transistors Q are provided between each column and input/output lines I/O, bI/O of the memory array. Since the sense amplifier SA associated with each column (of which the first and second bit-lines and bit-line bars BL0/bBL0, BL1/bBL1 are shown) will generate a bit that corresponds to a memory cell CL associated with a selected row (as determined by the selected word-line WL), a column select signal (generally designated CSL) is provided to the transistors Q to select one of the columns, which is coupled to the input/output lines I/O, bI/O. Of course, some architectures will include multiple input/output lines I/O, bI/O in which case a single select signal CSL is coupled to the transistors Q of more than one column.

A secondary sense amplifier SSA is coupled to each input/output line I/O, bI/O to amplify a voltage level associated therewith. The secondary sense amplifier SSA is synchronized with a logic that enables the column select signal CSL. In an advantageous embodiment, this secondary sense amplifier SSA includes a sense amplifier for reading, but also write buffers for driving the input/output lines I/O, bI/O. Basically, the secondary sense amplifier SSA assumes one of three states, namely, pre-charged (if no read or write), read, or write.

When a read command is issued, the column select signals CSL are activated and the sense amplifiers SA (basically clocked latches) are connected to the input/output lines I/O, bI/O. The clocking of the latches of the sense amplifiers SA is synchronized with an activation of the column select signals CSL. When a write command is issued, the column select signals CSL are again activated, but the sense amplifier SA is disconnected from the input/output lines I/O, bI/O and the write drivers are connected in lieu thereof. As in the case of a read, the clocking of the drivers is synchronized with the activation of the column select signals CSL.

A write operation is performed in analogously to the read operation. Typically, a word-line WL has been previously activated (e.g., a bank is active). Subsequently, data is placed on the input/output lines I/O, bI/O and the column select signals CSL are activated. As a result, a primary sense amplifier SA is overwritten causing the bit-lines and bit-line bars BL, bBL to change state (in the case of a different data state) and the data is transferred to a memory cell CL.

To be compliant with international standards for reading or writing data in or out of DRAM devices, a sequence of timings should be met. For example, many presently available DRAMs comply with the standards set by JEDEC (once known as Joint Electron Device Engineering Council). As an example, the following JEDEC standards, namely, JEDEC double data rate (DDR) synchronous dynamic random access memory (SDRAM) specifications JESD79, DDR3332.5-3.3 and DDR 266 2-2-2, are provided for illustrative purposes and are incorporated herein by reference. Additionally, for additional information about of an operation of a DRAM, see U.S. patent application Ser. No. 10/285,027, entitled "Memory Device with a Column Select being Variably Delayed," filed on Oct. 31, 2002, to Streif, et al., which is commonly assigned with the present invention and incorporated herein by reference.

Thus, as mentioned above with respect to FIG. 2, the DRAM incorporates two modes of operation wherein the normal mode embodies a mode typically defined in a DRAM specification and the low power mode embodies a mode wherein, for instance, only half of an address space of the memory array is available. In an advantageous embodiment, the low power mode may be implemented by connecting the first bit-line BL0 and the second bit-line bar BL1 to a memory cell CL.

One way of connecting the first and second bit-lines BL0, BL1 with a memory cell CL is to activate two word-lines WL as opposed to only one word-line WL (see, for instance, U.S. Pat. No. 6,594,195 entitled "Low-Power, High-Density Semiconductor Memory Device," issued Jul. 15, 2003, to Chen, which is incorporated by reference). Preferably, the activated word-lines WL should not be adjacent to avoid cluster fails between memory cells CL. Thus, the row decoder RDCR may select the first and third word-lines WL0, WL2 in accordance with an address select signal SADDR from a control system 210 of a DRAM as illustrated and described with respect to FIG. 2. In other embodiments, the low power mode of the DRAM may be implemented by modifying a design of the sense amplifiers SA of the memory array.

With continuing reference to FIGS. 2 and 3, an exemplary embodiment of a transition from a normal mode to a low power mode for a DRAM will hereinafter be described. Initially, the mode selection circuit 230 of the control system 210 prohibits access to an upper half of the memory array 280 of the DRAM. Stated another way, the row and column decoders 250, 270 in communication with mode selection circuit 230 select rows and columns that form about half of the memory array 280 of the DRAM. A refresh control signal is thereafter provided to refresh the DRAM within a specified retention time associated with the normal mode of operation. Each refresh cycle activates a word-line (e.g., the first word-line WL0) in the valid half of the memory array 280, sets a sense amplifier SA thereof, and then activates another word-line (e.g., the third word-line WL2), effectively copying an inverse state of the memory cells CL connected to the first word-line WL0 into the memory cells CL connected to the third word-line WL2. Once the memory array 280 has been refreshed and copied, subsequent accesses are executed with the first and third word-lines WL0, WL2 being activated concurrently and prior to setting the sense amplifiers SA. The refresh rate might now be lowered to a value as specified for the low power mode of operation.

To transition the DRAM from a low power mode to a normal mode, the control system 210, in an advantageous embodiment, performs the following steps. A refresh control signal is provided to refresh the DRAM within a specified retention time associated with the normal mode of operation. During the refresh cycles, the first and third word-lines WL0, WL2 will be activated concurrently. Once the DRAM has been refreshed, the mode selection circuit 230 releases an upper half of the memory array 280 and activates, from that point forward, one word-line (either the first or third word-lines WL0, WL2) at a time. It should be understood that normal accesses to the memory array 280 can be interleaved with both the aforementioned procedures. The control system 210 should, however, ensure that the memory array 280 is refreshed within the prescribed period of time. Any access to the memory array 280 that conforms to the aforementioned procedures may be executed.

Inasmuch as two word-lines (e.g., the first and third word-lines WL0, WL2) may be activated in the low power mode, a refresh current employed to refresh one bit of information may increase somewhat. A time between refresh cycles, however, increases at a much higher rate thereby significantly decreasing an overall average refresh current of the DRAM. Also, since only about half of the memory array 280 is available during the low power mode, a DRAM in the low power mode will consume higher power when an electronic device employing the DRAM is in an active phase. Thus, it is preferable that the control system 210 of the present invention transitions the DRAM to the normal mode when the electronic device enters the active phase of operation.

Figure 4:
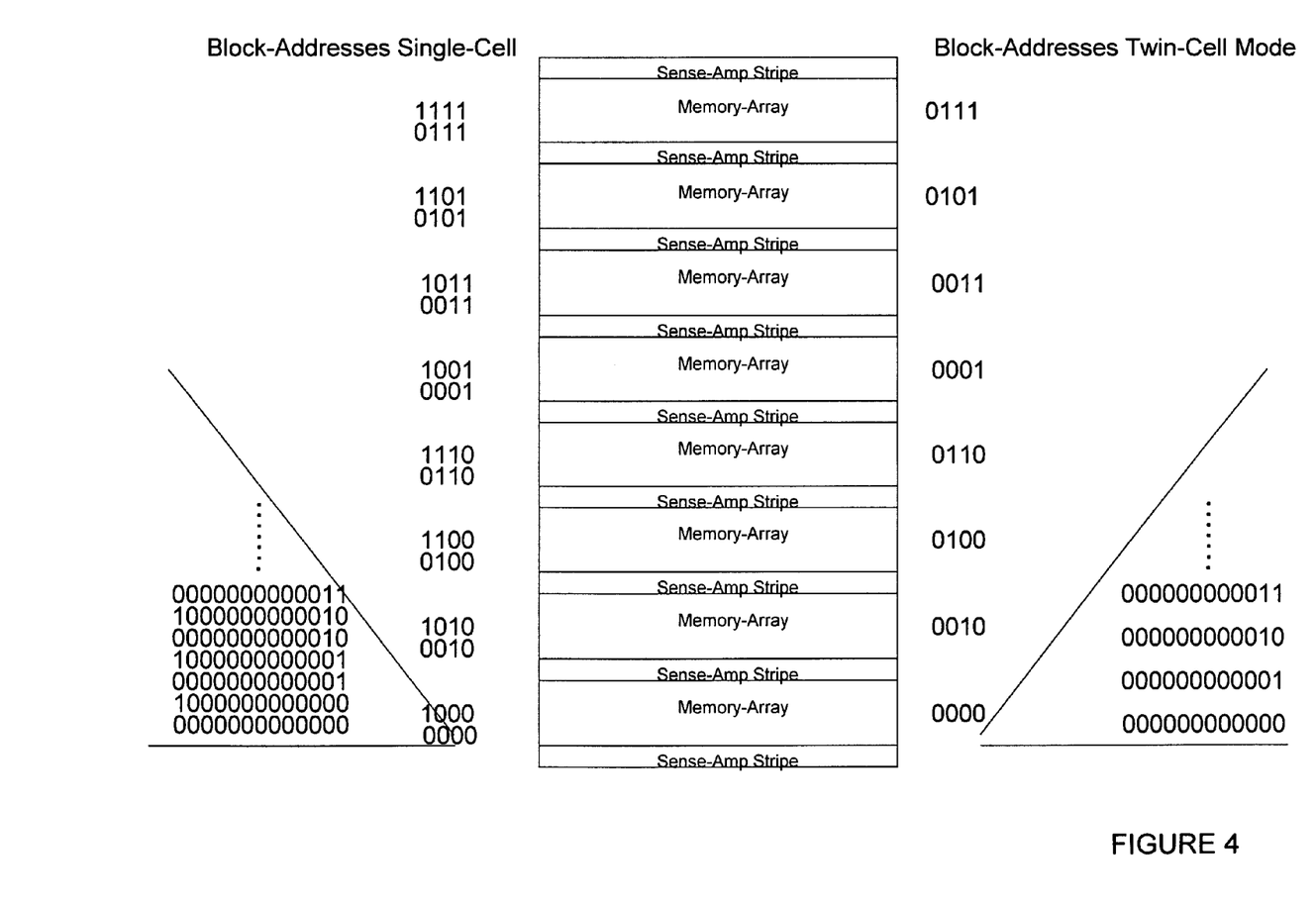
FIG. 4 illustrates a memory-array that is divided by sense-amplifier stripes.

FIG. 4 shows a memory-array that is divided by sense-amplifier stripes. The sub-array in between two sense-amp stripes is called a "block" and the associated addresses block-select addresses (=high order row addresses). In this example, one "block" is the smallest unit that can be selected to operate in single- or twin-cell mode individually. Other ways of dividing the array into sub-arrays are possible as well. This is just one embodiment.

The block-addresses or the twin/single-cell unit-addresses are scrambled in such a way that two logically adjacent blocks never share a sense-amplifier stripe. By scrambling addresses this way, it is possible for the user to access one block (e.g. block '0111') while at the same time a second block with the block-address logically subsequent to the first block (block '1000' in the above given example) is enabled by transitioning the second block from twin- to single-cell mode.

The lower order address-scrambling for both twin- and single-cell mode is shown in the blow-ups in FIG. 4. Word-lines that make up the blocks '0000' and '1000' in single-cell operation are interleaved if adjacent word-lines are used for the twin-cell activation. Other decoding-schemes for the twin-cell mode are possible as well, as long as both word-lines are within the same block between two sense-amplifier stripes.

The following paragraphs discuss the registers used to program the operating-modes of the sub-arrays. Table 1 explains the functionality of the refresh-counter.

TABLE 1

| Mode | Fast-Ref | Twin-Cell | SngToTwin |
| --- | --- | --- | --- |
| Single-Cell | 1 | 0 | 0 |
| Single -> Twin | 1 | 0 | 1 |
| Twin-Cell | 0 | 1 | 0 |
| Twin -> Single | 1 | 1 | 0 |

Three bits are used for each individually programmable sub-array. The first bit 'Fast-Ref' indicates that the single-cell refresh-rate is required for this sub-array. This bit needs to be set if this block is operating in single-cell mode or if it transitioning in between modes. The second bit 'Twin-Cell' indicates that a twin-cell activation will occur with each access/refresh. This bit needs to be set if the block is operating in twin-cell mode or is in transition from twin-cell to single-cell operation. The third bit 'SngToTwin' indicates that the device is transitioning from single- to twin-cell operation. In this transition, a first row is activated via a first word-line. Cells coupled to this first word-line are then sensed and amplified and then copied onto the second row by activating the word-line associated with the second row, in addition to the first word-line.

The register 'FastRef' is used to control the refresh-frequency. One bit is reserved for each sub-array. Please note that the same bit controls both single-cell blocks in a twin-cell block, e.g., the single-cell blocks 0000 and 1000, which are addressed as 0000 in the twin-cell mode. Since these single-cell blocks are merged into the same twin-cell block, they always have to be operated in the same mode.

Figure 5A:
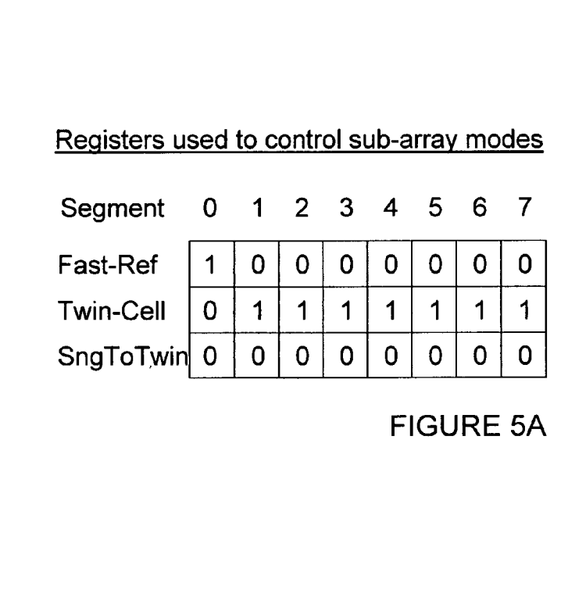
FIG. 5a illustrates registers used to control sub-array modes.
Figure 5B:
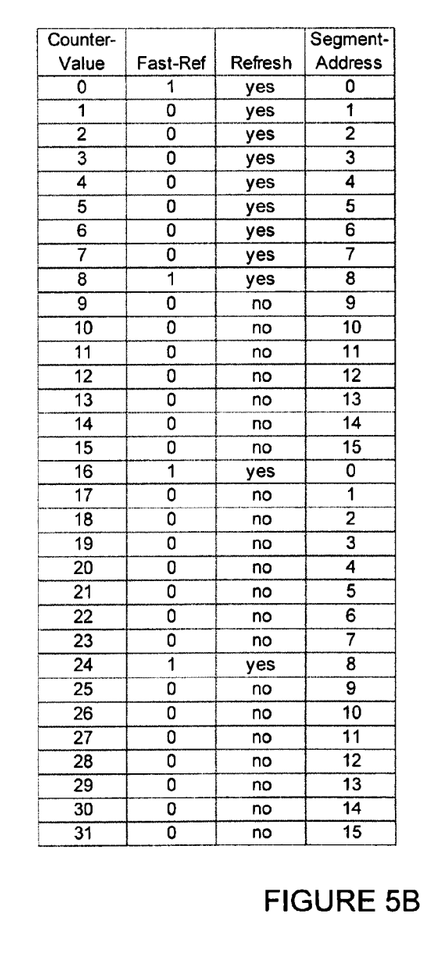
FIG. 5b provides a table illustrating the actions for each counter address.

The functionality of the refresh-counter will be discussed next with respect to FIGS. 5*a* and 5*b*. FIG. 5*a* illustrates the registers used to control sub-array modes and FIG. 5*b* provides a table illustrating the actions for each counter address. In the given example, eight twin-cell blocks/segments exist that transition into 16 single-cell blocks or segments. If the twin-cell retention-time is supposed to be twice the single-cell retention-time, a counter that wraps at 2*16=32 is used. Alternatively, the ratio single-cell refresh to twin-cell refresh can be adjusted by wrapping counter at different end value (e.g. 48 for a factor of 3, 64 for a factor of 4, etc.).

The bits <2:0> of the counter correspond to the 'FastRef'-bits. If this bit is 1, a refresh will be executed regardless of the higher order bits. In addition, refreshes will be executed for all combinations 00xxx of the counter. The counter-bits <3:0> correspond to the single-cell blocks/segments. By using a different multiple of 16 as wrap address for the counter, the retention-ratio between single- and twin-cell can be modified.

If it is known that the controller will fill the address-space linearly (true for most controllers when they first copy program-code from a hard-drive or flash) and/or free up address-space linearly (e.g., LIFO, stacks, etc.) it is possible to allow the DRAM an adaptive transition from twin- to single-cell mode and/or vice versa. That is, the DRAM can decide 'on its own' that the available address-space is nearly used up and transitions a sub-block from twin- to single-cell mode).

With the addressing as shown in FIG. 4, i.e., in twin-cell mode, the block-address space 0000 . . . 0111 is available. Once this space is filled up or close to being filled up, block 0000 transitions from twin to single cell, making addresses 0000 . . . 1000 available. Note that blocks 0000 and 1000 are now operating in single-cell mode, while 0001 . . . 0111 are still in twin-cell mode. With increased memory-demand this procedure is repeated until all blocks have transitioned to single-cell mode.

If the address-space is filled up linearly, the first user access to block 0111 could be used as an indication to start the transition of 0000, thus making block 1000 available. This can be repeated in the same fashion for all subsequent blocks.

Using the address-scrambling as shown in FIG. 4, it is possible to concurrently activate a word-line in block 0111 and in block 1000 (or in block 1000 and 1001, etc.). In order to fill the block 0111 with useful data, all word-lines have to be activated and data has to be written into the cells associated with each word-line. At the same time each word-line in block 1000 has to be refreshed before the transition from twin- to single-cell can happen. It can be easily seen that these refreshes can be hidden within the timeframe that it takes to write data to the previous block (if address-space is used linearly and if concurrent activation is possible). The same holds true if address-space is freed up linearly.

In one embodiment, the 'FastRef' bit of segment 0000 is set as soon as the first access to segment 0111 occurs. In addition, with each customer access to address 0111xxxx a refresh will be executed to address 0000xxxx. Then when the first access to segment 1000 occurs, the 'TwinCell'-bit is reset for block 0000. This concept ensures that all word-lines in block 0000 will be refreshed within the shorter single-cell retention-time even if it takes less time to fill up segment 0111 than it takes to refresh segment 0000 using the normal refresh-counter pulses. Note that this concept only works if each word-line of block 0111 is accessed (which is the case if the address is filled linearly). Otherwise it cannot be ensured that all word-lines of segment 0000 have been refreshed prior to being switched to single-cell mode.

Some controllers fill the memory with code starting at the bottom and with data starting from the top. To accommodate this scheme, the addressing can be scrambled in a way that in twin-cell mode the first and the last quarter of the single-cell address-space is accessible and the middle will be gradually made available when the transition from twin- to single-cell occurs. The selection between an addressing as described here and the linear addressing as described before could be done via control-register and could be realized on the same device. Other non-linear addressing-schemes are possible as well.

Figure 6:
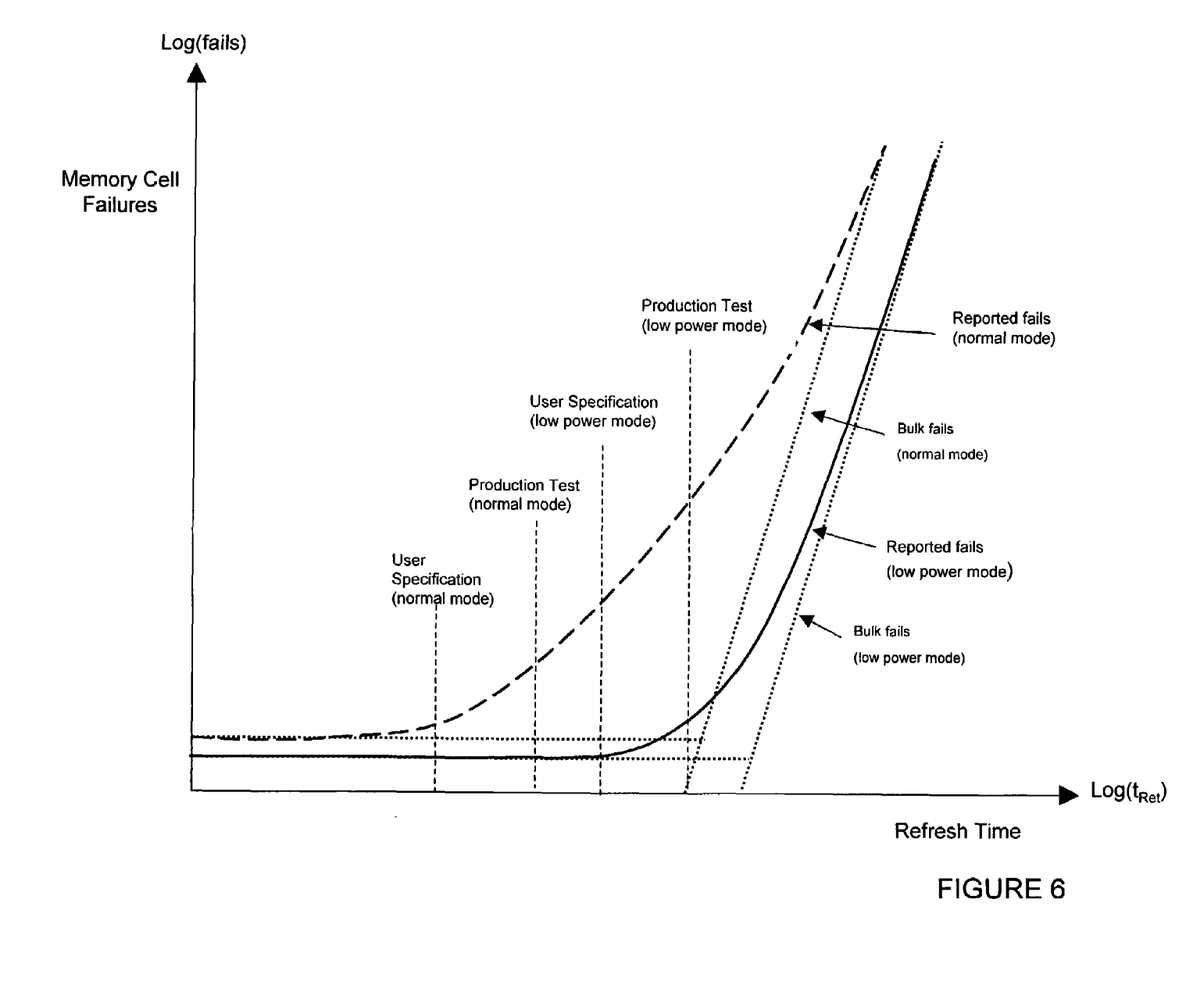
FIG. 6 illustrates an x-y diagram demonstrating a relationship between memory cell fails versus refresh time for a DRAM according to the principles of the present invention.

Turning now to FIG. 6, the diagram demonstrates a relationship between memory cell fails versus refresh time for a DRAM according to the principles of the present invention. In the low power mode and in accordance with the activation techniques described above, the address space of the memory array may be reduced by about a half. The DRAM, however, exhibits an increase in retention time caused by the foregoing effects. As mentioned above, the number of memory cells that demonstrate retention fails is small compared to the number of memory cells on an integrated circuit. If two memory cells are employed to store data, the likelihood of both memory cells being marginal (i.e., showing retention fails) is relatively small. In most cases, one memory cell may lose its information while the other memory cell fails in a bulk fail region. Since a voltage bounce caused by one memory cell is typically enough to flip a sense amplifier of a memory array, redundant array elements may be employed on the integrated circuit to repair the memory cells to a significantly higher retention time (which may be closer to the bulk fail region).

Additionally, as demonstrated by a bulk fails, low power mode waveform, the bulk fails during the low power mode trend toward higher retention times. Bulk fails are typically caused by normal thermal discharging of the memory cells through transistor sub-threshold leakage. The failures begin to occur when a voltage across the memory cell is so small that transitioning the transistor to a non-conducting state causes a voltage bounce on a bit-line of the memory array which is too small (e.g., 50 millivolts) for the sense amplifier to switch in time. If two bit-lines are connected to the memory cells, the memory cells store data of opposite polarities. As a result, a 50 millivolt difference in potential between the bit-line and bit-line bar is achieved by a 25 millivolt drop on one of the bit-line and bit-line bar, while the other rises by 25 millivolts. Therefore, the bulk fails begin to occur about one half-life later (see bulk fails, low power mode waveform).

With respect to the production testing of the DRAM, it is preferable to perform separate retention tests for the normal and low power modes of operation. For instance, the retention test for the normal mode of operation may be performed employing a 256 ms retention time whereas the retention test for the low power mode of operation may be performed employing 1024 ms retention time. Thereafter, a different repair solution may be employed to replace memory cells failing under either test in the different modes of operation.

Thus, a control system for use with a DRAM employable in an electronic device, a method of operating a DRAM, and a DRAM with readily attainable and quantifiable advantages has been introduced. Those skilled in the art should understand that the previously described embodiments of the control system and related method for providing a normal mode and low power mode of operation of operation for a DRAM are submitted for illustrative purposes only that other embodiments capable of providing varying modes of operation for a memory device are well within the broad scope of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a dynamic random access memory (DRAM) device that includes memory cells organized in a plurality of blocks, the method comprising:
   storing data in a first block of memory cells, the data being stored in the first block in a single cell mode; and
   storing data in a second block of memory cells, the data being stored in the second block in a twin cell mode, wherein the second block stores data in the twin cell mode at the same time the first block stores data in the twin cell mode.

2. The method of claim 1, further comprising performing a refresh operation, wherein the reference operation refreshes cells of the first block at a first refresh rate and refreshes cells of the second block at a second refresh rate that is longer than the first refresh rate.

3. The method of claim 1, further comprising:
   storing data in a third block of memory cells, the data being stored in the third block in a first mode; and
   transitioning the third block to store the data in a second mode, wherein the first mode comprises one of the single cell mode or the twin cell mode and the second mode comprises the other of the single cell mode or the twin cell mode.

4. A method of operating a dynamic random access memory device, the method comprising:
   providing an array of dynamic random access memory cells arranged in a plurality of blocks; and
   storing data in ones of the blocks of memory cells, wherein the data is stored in either a single cell mode or a twin cell mode as a function of the block.

5. The method of claim 4, further comprising receiving mode information, the mode information determining whether a particular block of the plurality of blocks stores data in the single cell mode or the twin cell mode.

6. The method of claim 5, wherein the mode information is received from an external controller.

7. The method of claim 5, wherein the mode information is determined by circuitry on-chip with the array of dynamic random access memory cells.

8. The method of claim 4, wherein storing data in ones of the blocks of memory cells comprises operating in an adaptive mode in which the device selects a mode of operation based upon address-locations of accesses that are requested.

9. The method of claim 4, wherein, during a sleep mode, each of the blocks of memory cells is operated in the twin cell mode.

10. A method of operating a digital recording device, the method comprising:
- recording a digital image;
- storing the recorded digital image in a dynamic random access memory, the recorded digital image being stored in a single cell mode;
- processing the recorded digital image; and
- storing the processed digital image in the dynamic random access memory, the processed digital image being stored in a twin cell mode.

11. The method of claim 10, wherein storing the recorded digital image comprises transferring data from a charge-coupled device to the dynamic random access memory in an uncompressed fashion.

12. The method of claim 10, further comprising transmitting the processed digital image from the dynamic random access memory.

13. The method of claim 12, further comprising causing the dynamic random access memory to transition from the twin cell mode to the single cell mode prior to transmitting the processed digital image.

14. The method of claim 10, wherein, prior to recording the digital image, the method further comprises:
- receiving an indication that an image is to be recorded; and
- causing the dynamic random access memory to transition from the twin cell mode to the single cell mode.

15. The method of claim 10, wherein storing the recorded digital image in the dynamic random access memory comprises storing the recorded digital image in a portion of the dynamic random access memory, wherein the recorded digital image is stored in the single cell mode while other portions of the dynamic random access memory store data in the twin cell mode.

* * * * *